US010064266B2

(12) United States Patent
Fitzpatrick et al.

(10) Patent No.: US 10,064,266 B2
(45) Date of Patent: Aug. 28, 2018

(54) CIRCUIT BOARD HAVING ARC TRACKING PROTECTION

(75) Inventors: Kevin J. Fitzpatrick, Saint Joseph, MI (US); Ryan K. Roth, Saint Joseph, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 1183 days.

(21) Appl. No.: 13/185,583

(22) Filed: Jul. 19, 2011

(65) Prior Publication Data

US 2013/0021131 A1 Jan. 24, 2013

(51) Int. Cl.

| | |
|---|---|
| ***H01H 85/04*** | (2006.01) |
| ***H05K 1/02*** | (2006.01) |
| ***H01H 85/46*** | (2006.01) |
| *A47L 15/46* | (2006.01) |
| *H01R 12/70* | (2011.01) |

(52) U.S. Cl.

CPC ........... *H05K 1/0256* (2013.01); *H01H 85/04* (2013.01); *H01H 85/463* (2013.01); *A47L 15/46* (2013.01); *H01R 12/7088* (2013.01); *H05K 1/0263* (2013.01); *H05K 2201/012* (2013.01); *H05K 2201/09063* (2013.01); *H05K 2201/09081* (2013.01); *H05K 2201/09872* (2013.01); *H05K 2201/10181* (2013.01); *H05K 2201/10189* (2013.01)

(58) Field of Classification Search

CPC .... H01H 85/463; H01H 85/04; H05K 1/0256; H05K 1/0263; H05K 2201/10181; H05K 2201/012; H05K 2201/09063; H05K 2201/09081; H05K 2201/09872; H05K 2201/10189; A47L 15/46; H01R 12/7088

USPC ................................ 337/297, 290, 295, 159

See application file for complete search history.

(56) References Cited

U.S. PATENT DOCUMENTS

| | | | | |
|---|---|---|---|---|
| 3,585,556 | A * | 6/1971 | Hingorany et al. | 337/297 |
| 4,322,777 | A | 3/1982 | Ueta et al. | |
| 4,394,639 | A * | 7/1983 | McGalliard | 337/292 |
| 4,404,536 | A * | 9/1983 | Still | 337/201 |
| 4,520,338 | A * | 5/1985 | Watanabe | 337/297 |
| 5,099,219 | A * | 3/1992 | Roberts | 337/297 |
| 5,192,940 | A * | 3/1993 | Yajima et al. | 338/308 |
| 5,280,262 | A * | 1/1994 | Fischer | 337/405 |
| 5,543,774 | A * | 8/1996 | Lof | 337/297 |
| 5,933,307 | A | 8/1999 | West | |
| 6,043,966 | A * | 3/2000 | Krueger et al. | 361/104 |
| 6,084,759 | A | 7/2000 | Hansson et al. | |
| 6,384,708 | B1 * | 5/2002 | Jollenbeck et al. | 337/297 |
| 6,614,341 | B2 * | 9/2003 | Martin | 337/297 |
| 7,116,208 | B2 * | 10/2006 | Nishimura et al. | 337/296 |
| 7,161,784 | B2 | 1/2007 | Cheung et al. | |
| 7,477,130 | B2 * | 1/2009 | Fukushige et al. | 337/297 |
| 7,594,513 | B2 | 9/2009 | Vanderroest et al. | |
| 2010/0141375 | A1 * | 6/2010 | Liptak | 337/297 |

FOREIGN PATENT DOCUMENTS

GB 1385606 2/1975

* cited by examiner

*Primary Examiner* — Anatoly Vortman

(74) *Attorney, Agent, or Firm* — McGarry Bair PC

(57) ABSTRACT

A printed circuit board to which corresponding wiring connectors such as power wiring connectors, may be connected to couple electrical components and a power supply to the printed circuit board and a control housing, which may be used for operably storing such a printed circuit board.

18 Claims, 9 Drawing Sheets

220 218 214 216 220 202 220 210 208 212 222 200 220 220 204 206 204

CIRCUIT BOARD HAVING ARC TRACKING PROTECTION

BACKGROUND OF THE INVENTION

Contemporary appliances, an example of which includes automatic dishwashers, perform cycles of operation and often have electrical and mechanical components responsible for implementing the cycle of operation of the appliance, with one or more of the components controlling the operation of the other components. For example, a controller, such as a microprocessor-based controller, having a circuit board with memory may issue commands to the other components to control them to implement a cycle of operation and such circuit boards may be susceptible to arc tracking events.

SUMMARY OF THE INVENTION

The invention relates to a circuit board having a substrate, a slot in the substrate defining a peninsula element, a power input connector provided on the peninsula element, and an electrical trace provided on the substrate and extending onto the peninsula element and conductively connected with the power input connector. The power input connector is spaced from a junction of the peninsula element and the substrate to define a fuse region in the peninsula element that evanesces with heat in response to arc tracking along the electrical trace to the power input connector to electrically open the power input pin relative to the electrical trace.

DESCRIPTION OF EMBODIMENTS OF THE INVENTION

Figure 1:
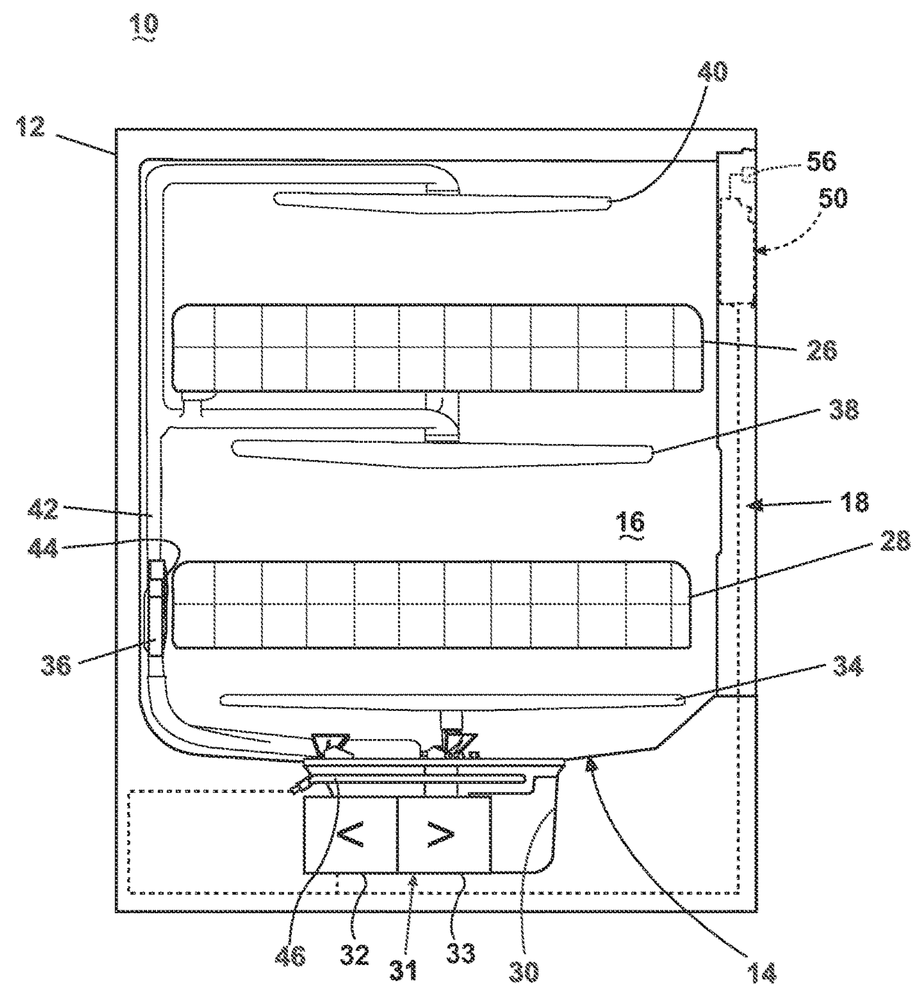
FIG. 1 is a schematic, cross-sectional view of a dishwasher according to a first embodiment of the invention.

In FIG. 1, a first embodiment of the invention is illustrated in the environment of an automated dishwasher 10 having a chassis 12. The chassis 12 defines an interior and may be a frame with or without panels mounted to the frame. The dishwasher 10 shares many features of a conventional automated dishwasher, which will not be described in detail herein except as necessary for a complete understanding of the invention. The chassis 12 houses an open-faced wash tub 14 that at least partially defines a treating chamber 16, having an open face, for washing utensils. A door assembly 18 may be movably mounted to the dishwasher 10 for movement between opened and closed positions to selectively open and close the open face of the wash tub 14. Thus, the door assembly provides accessibility to the treating chamber 16 for the loading and unloading of dishes or other washable items.

It should be appreciated that the door assembly 18 may be secured to the lower front edge of the chassis 12 or to the lower front edge of the wash tub 14 via a hinge assembly (not shown) configured to pivot the door assembly 18. When the door assembly 18 is closed, user access to the treating chamber 16 may be prevented, whereas user access to the treating chamber 16 may be permitted when the door assembly 18 is open.

Utensil holders, illustrated in the form of upper and lower utensil racks 26, 28, are located within the treating chamber 16 and receive dishes for washing. The upper and lower racks 26, 28 are typically mounted for slidable movement in and out of the treating chamber 16 for ease of loading and unloading. Other utensil holders may be provided, such as a silverware basket. As used in this description, the term "utensil(s)" is intended to be generic to any item, single or plural, that may be treated in the dishwasher 10, including, without limitation, dishes, plates, pots, bowls, pans, glassware, and silverware.

While the present invention is described in terms of a conventional dishwashing unit as illustrated in FIG. 1, it could also be implemented in other types of dishwashing units such as in-sink dishwashers or drawer dishwashers including drawer dishwashers having multiple compartments. For drawer-type dishwashers, the surrounding cabinet in combination with the sliding drawer takes the place of the door assembly 18.

A spray system is provided for spraying liquid in the treating chamber 16 and is provided in the form of a first lower spray assembly 34, a second lower spray assembly 36, a rotating mid-level spray arm assembly 38, and/or an upper spray arm assembly 40. Upper sprayer 40, mid-level rotatable sprayer 38 and lower rotatable sprayer 34 are located, respectively, above the upper rack 26, beneath upper rack 26, and beneath the lower rack 24 and are illustrated as rotating spray arms. The second lower spray assembly 36 is illustrated as being located adjacent the lower utensil rack 28 toward the rear of the treating chamber 16. The second lower spray assembly 36 is illustrated as including a vertically oriented distribution header or spray manifold 44. Such a spray manifold is set forth in detail in U.S. Pat. No. 7,594,513, issued Sep. 29, 2009, and titled "Multiple Wash Zone Dishwasher," which is incorporated herein by reference in its entirety.

A recirculation system is provided for recirculating liquid from the treating chamber 16 to the spray system. The recirculation system may include a sump 30 and a pump assembly 31. The sump 30 collects the liquid sprayed in the treating chamber 16 and may be formed by a sloped or recess portion of a bottom wall of the tub 14. The pump assembly 31 may include both a drain pump 32 and a recirculation pump 33. The drain pump 32 may draw liquid from the sump 30 and pump the liquid out of the dishwasher 10 to a household drain line (not shown). The recirculation pump 33 may draw liquid from the sump 30 and the liquid may be simultaneously or selectively pumped through a supply tube 42 to each of the assemblies 34, 36, 38, 40 for selective spraying. While not shown, a liquid supply system may include a water supply conduit coupled with a household water supply for supplying water to the treating chamber 16.

A heating system including a heater 46 may be located within the sump 30 for heating the liquid contained in the sump 30.

A controller 50 may also be included in the dishwasher 10, which may be operably coupled with various components of the dishwasher 10 to implement a cycle of operation. The controller 50 may be located within the door 18 as illustrated, or it may alternatively be located somewhere within the chassis 12. The controller 50 may also be operably coupled with a control panel or user interface 56 for receiving user-selected inputs and communicating information to the user. The user interface 56 may include operational controls such as dials, lights, switches, and displays enabling a user to input commands, such as a cycle of operation, to the controller 50 and receive information.

Figure 2:
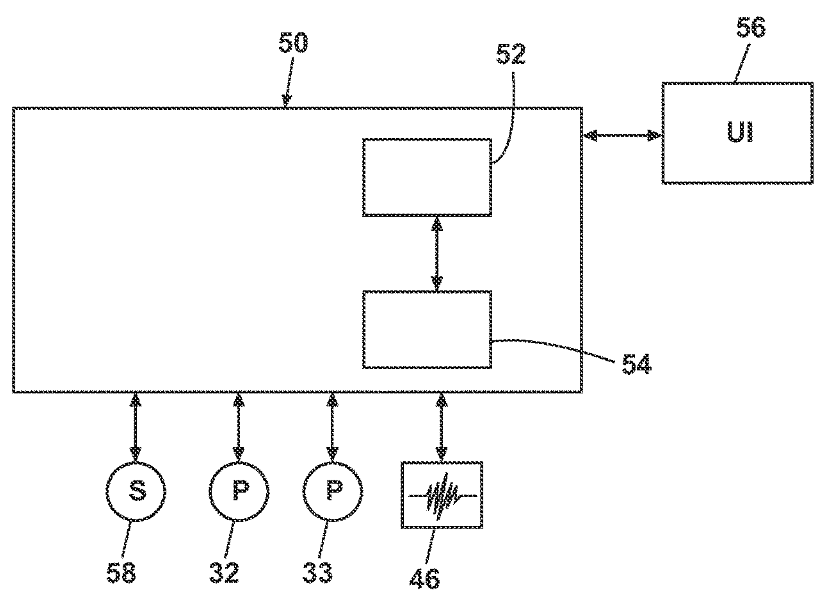
FIG. 2 is a schematic view of a controller of the dishwasher of FIG. 1.

As illustrated schematically in FIG. 2, the controller 50 may be coupled with the heater 46 for heating the wash liquid during a cycle of operation, the drain pump 32 for draining liquid from the treating chamber 16, the recirculation pump 33 for recirculating the wash liquid during the cycle of operation. The controller 50 may be provided with a memory 52 and a central processing unit (CPU) 54. The memory 52 may be used for storing control software that may be executed by the CPU 54 in completing a cycle of operation using the dishwasher 10 and any additional software. For example, the memory 52 may store one or more pre-programmed cycles of operation that may be selected by a user and completed by the dishwasher 10.

The controller 50 may also receive input from one or more sensors 58. Non-limiting examples of sensors that may be communicably coupled with the controller 50 include a temperature sensor, turbidity sensor to determine the soil load associated with a selected grouping of utensils, such as the utensils associated with a particular area of the treating chamber and a sensor for determining a load value at selected locations within the dishwasher 10. The load value may be reflective of either or both a utensil load, i.e. the number and/or size of the utensils in the dishwasher, and/or a soil load, i.e. the quantity of soil on the utensils.

Figure 3:
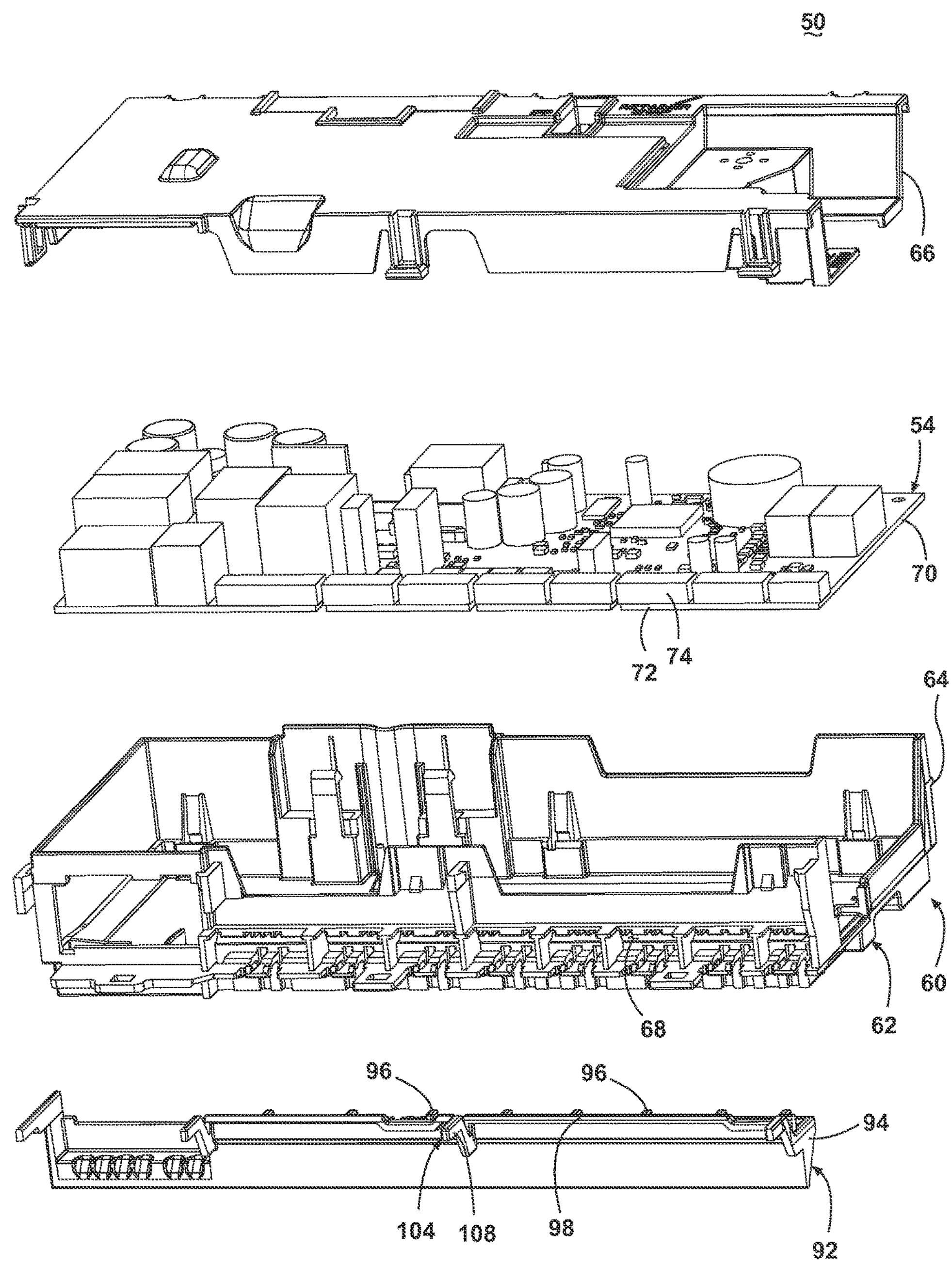
FIG. 3 is an exploded perspective view of an exemplary control housing assembly including a controller, housing and connector brace which may be used in the dishwasher of FIG. 1.

FIG. 3 illustrates an exploded view of exemplary components, which may make up the controller 50 in the form of a microprocessor-based controller implemented in a printed circuit board (PCB) 54, which is housed in a control housing assembly 60.

The PCB 54 may include a board 70 on which parts including memory, a microprocessor, as well as other circuit elements (e.g., resistors, diodes and capacitors) may be mounted. The PCB 54 has an edge 72 along which multiple edge connectors 74 are provided, that may supply power, grounding, and data transmission to the PCB 54.

The control housing assembly 60 includes a housing 62 and a connector brace 92. The housing 62 is illustrated as a separate base 64 and cover 66, which may be assembled to define an interior for receiving the PCB 54. The base 64 and cover 66 may include multiple cooperating prongs and slots for securing the base 64 and cover 66 together. The housing 62 may be provided with support members for retaining and securing the PCB 54 within the interior of the housing 62. Additionally, the housing 62 may include a slot 68 through which the PCB 54 may be accessible. More specifically, the base 64 has been illustrated as having a slot 68. The edge connectors 74 may be accessible through the slot 68 when the PCB 54 is mounted within the housing 62.

Figure 4:
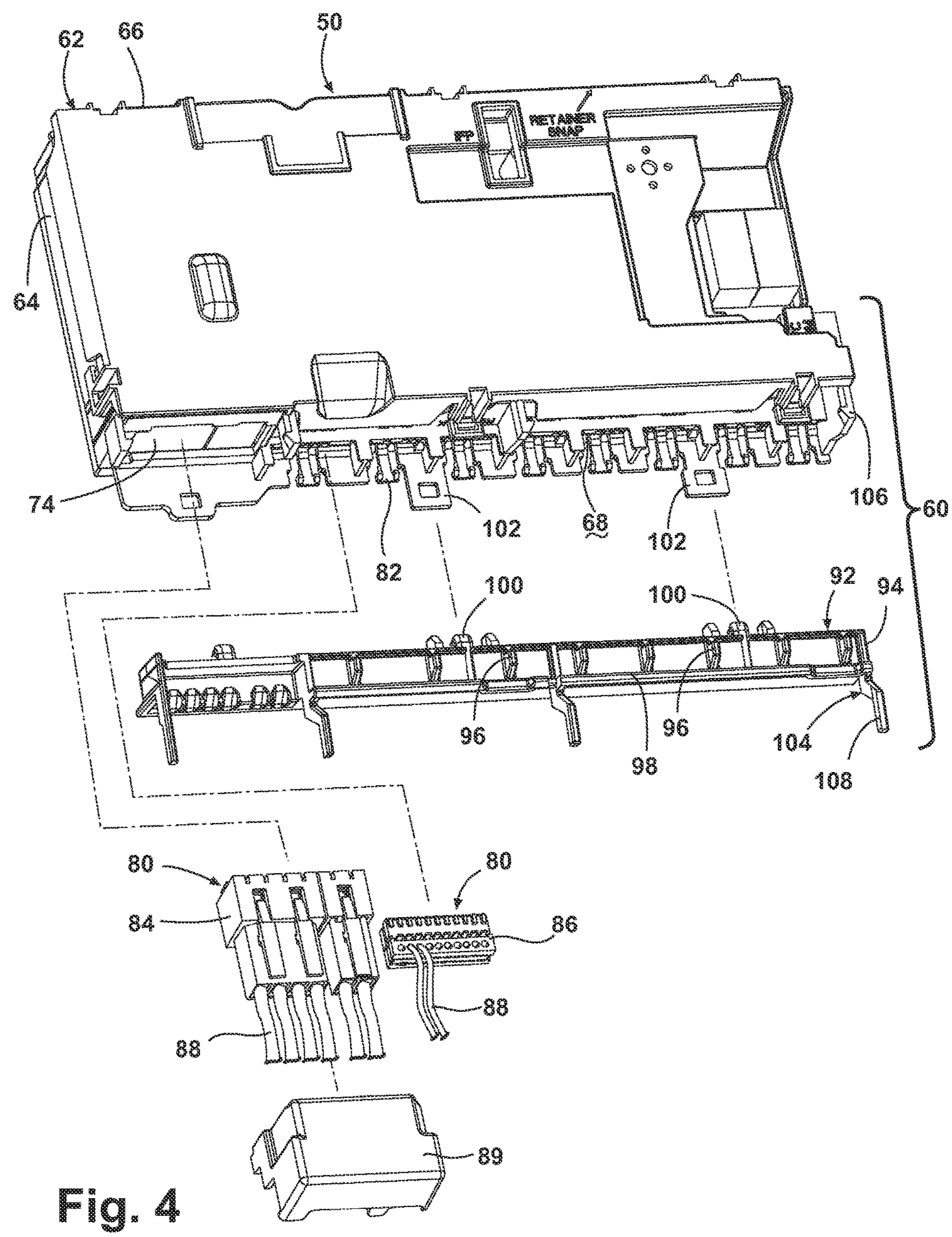
FIG. 4 is a partially assembled control housing assembly of FIG. 1, with the connector brace shown unassembled.

Referring to FIG. 4, prior to describing the connector brace 92, a brief digression into the electrical systems of the appliance will provide a more complete understanding. Wiring connectors 80 are provided within the electrical system of the appliance to couple, for power supply and/or data, the various electrical elements to the PCB 54. The physical connection between the edge connectors 74 and wiring connectors 80 is push/pull in that the wiring connectors 80 need only be pushed onto the corresponding edge connector 74 to be installed and pulled off of to be uninstalled. The term “onto” is not meant to be limiting and it has been contemplated that the wiring connectors 80 may be pushed into or over a corresponding edge connector 74. At least one of the edge connectors 74, the wiring connectors 80, and the housing 62 may have a latching feature 82 to ensure the wiring connector 80 is securely coupled with its corresponding edge connector 74 when it is properly inserted thereon.

Two exemplary wiring connectors 80 have been illustrated in FIG. 4 and by way of non-limiting example include a power connector 84 and a data connector 86. The power connector 84 may provide the PCB 54 with power from a power source (not shown). The data connector 86 may make a wired connection between the PCB 54 and the other components of the dishwasher 10. Each of the wiring connectors 80 has wires 88 extending from it and couple to the various components, power supplies, etc. An optional cover 89 may be coupled with the housing 62 to enclose the power connector 84.

The connector brace 92 may include an elongated body 94, which may extend the length of the housing 62. The body 94 may include multiple projections 96, which are spaced along the length of the body 94. It has been contemplated that the number of projections and their spacing along the length of the body 94 may be varied. A rib 98 may project from the body 94 and may extend along at least a portion of its length.

Figure 5:
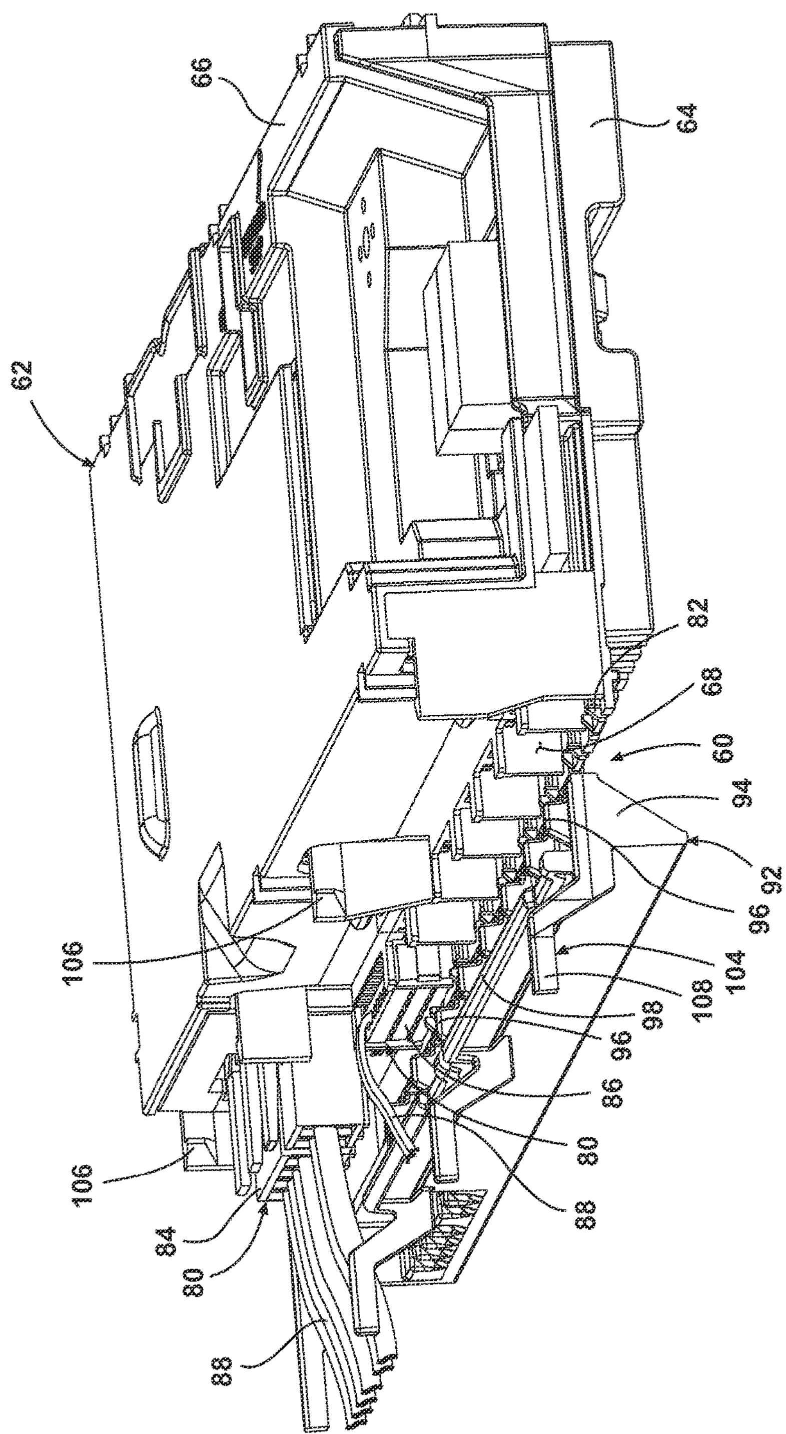
FIG. 5 is a perspective view of the assembled control housing assembly with the connector brace in an unlatched position.
Figure 6:
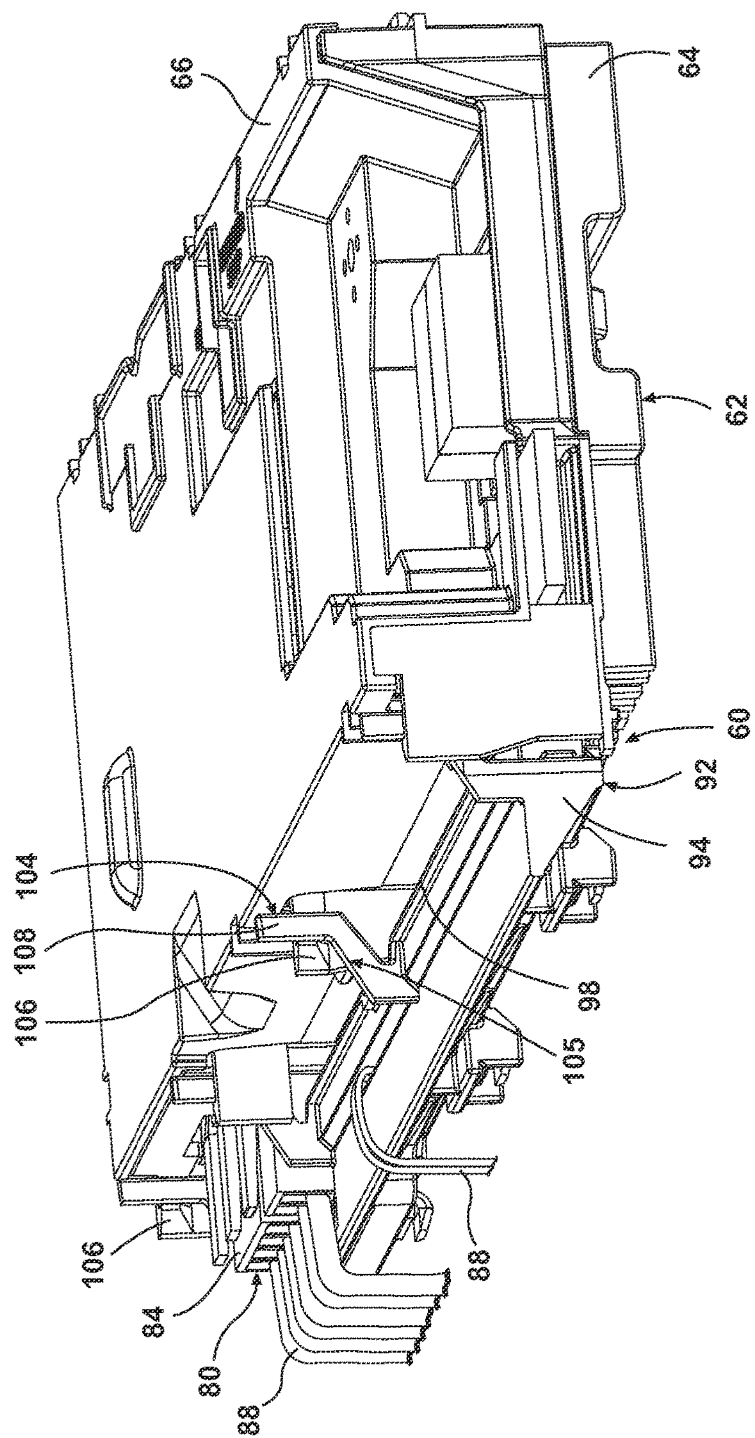
FIG. 6 is a perspective view of the assembled control housing with the connector brace in a latching position.

The body 94 may be hingedly mounted to the housing 62 for movement between an unlatched position (FIG. 5) and a latching position (FIG. 6). Any suitable hinge assembly may be used. By way of non-limiting example, a hook 100 may be provided on the connector brace 92 and a pin 102 may be provided on the housing 62. The hook 100 may catch the pin 102 to form a hinge between the housing 62 and connector brace 92. Alternatively, the hook 100 may be located on the housing 62 and the pin 102 may be located on the connector brace 92. The connector brace 92 may also include a lever 104 operably coupled with the body 94 such that the lever 104 may be grasped by a user to rotate the connector brace 92 about the hinge assembly to the latching position.

As illustrated more clearly in FIG. 6, the control housing assembly 60 may include a latch 105 for holding the connector brace 92 in the latching position. The latch 105 may include a hook 106 on one of the housing 62 and connector brace 92 and a complementary catch 108 on the other of the housing 62 and connector brace 92. It has been contemplated that the lever 104 may form a portion of the catch 108. Alternatively, it has been contemplated that the catch may be a separate portion. As illustrated, there may be multiple pairs of hooks 106 and catches 108 spaced along the connector brace 92 and housing 62 to form multiple latches 105 for holding the connector brace 92 in the latching position.

The operation of the connector brace 92 may be started with brief reference to FIG. 5, which illustrates the connector brace 92 in an un-rotated/unlatched position and FIG. 6, which illustrates the connector brace 92 in a rotated/latching position. When the connector brace 92 is moved to the latching position it overlies the slots 68 and may retain properly inserted wiring connectors 80 in a connected relationship with the corresponding edge connectors 74.

The connector brace 92 performs several functions as it rotates into the latching position including abutting the improperly inserted wiring connector 80 as the connector brace 92 is moved into the latching position to provide a force that is sufficient to properly insert the wiring connector 80 onto the corresponding edge connector 74 such that it may be fully inserted into the housing 62. Both the connector brace 92 and the projection 96 are sufficiently rigid so as to apply a sufficient force to any improperly inserted wiring connector 80 to properly insert the improperly inserted wiring connector 80 on to the corresponding edge connector 74 such that it may be fully received in the housing 62. The projection 96 may also apply a retaining force to the wiring connector 80 when the connector brace 92 is in the latching position and keep the wiring connectors 80 under tension, which results in less fretting corrosion. The rib 98 may provide a structure over which the wires 88 may drape when the connector brace 92 is in the latching position and may provide a strain relief element for the wires 88 of the wiring connector 80 and provide strain relief for the wires 88 when the connector brace 92 is in the latching position. The connector brace 92 may also provide a tensioning function that reduces the likelihood of fretting corrosion and a strain relief element as it acts to take weight off of the mating terminals on the controller, which results in less damage to solder joints in the controller.

It is contemplated that the control housing 62 may be formed from non-flammable plastic or metallic materials such that it may create an enclosure or shield around the PCB 54. Arc tracking is a potential failure mode of any electronic circuit boards, including PCB 54. Arc tracking may be caused by overheating of solder joints, such as by a large current draw when a heater fails, or may be caused by contaminants and/or carbonized board materials that bridge the spacing between conductors of opposite, high voltage polarity, and causes high energy shorts to occur. The high energy shorts lead to further carbonization, which may lead to overheating. The non-flammable control housing 62 may be used to protect against and contain an arc tracking.

Alternatively or additionally to the use of non-flammable materials, a thermal protector such as a thermal cut out (TCO), or non-resettable bimetal thermostat may be attached to the housing 62 to sense the heat from an arc tracking event and disconnect power from the controller 50 to stop the arc tracking activity. Such a thermal protector may minimize the time and energy that the control housing 62 must withstand and contain the event, which allows lower cost housing materials to be used.

Figure 7:
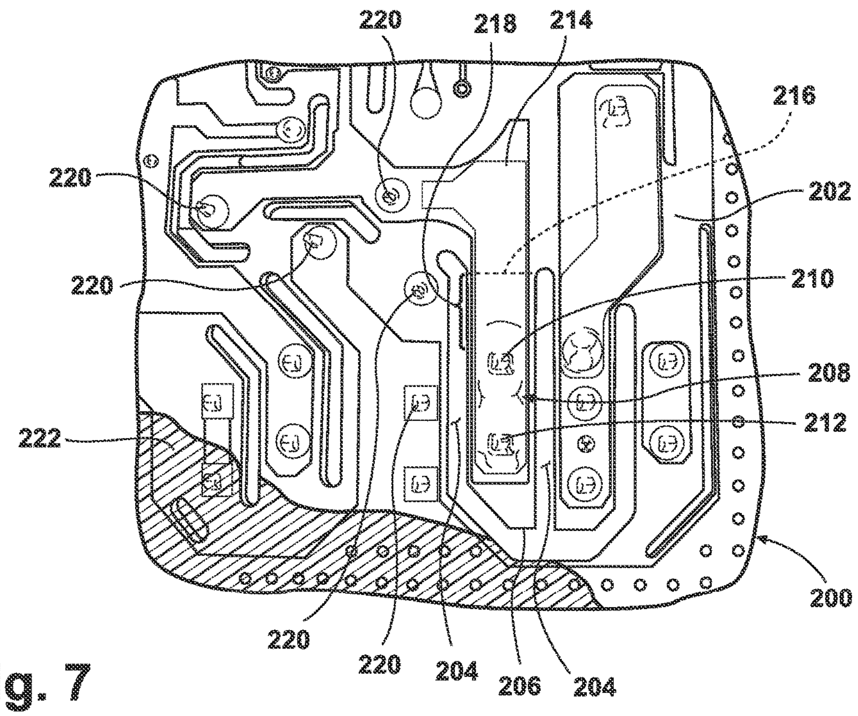
FIG. 7 is a top view of a portion of a circuit board according to a second embodiment of the invention, which may be used in the control housing of FIG. 3.

FIG. 7 illustrates a circuit board 200 according to a second embodiment, which is a variation of the PCB 54, which includes arc tracking protection. The circuit board 200 is identical in almost all other aspects to the PCB 54 disclosed in the first embodiment, other than the arc tracking protection, and has part numbers beginning with the 200 series, with it being understood that while like parts may not include like numerals the descriptions of the like parts of the earlier embodiment apply to the second embodiment, unless otherwise noted.

The circuit board 200 is illustrated as including a substrate 202, a slot 204, peninsula element 206, a power input connector 208 having a first power input pin 210 and a second power input pin 212, and an electrical trace 214. The substrate 202 may include insulating layers, which may include any suitable material including FR-2 material or FR-4 material.

The slot 204 is formed in the substrate 202 and defines from the substrate 202 the peninsula element 206, which joins the substrate 202 at a junction 216, the location of which is indicated by the dotted line. The power input connector 208 is provided on the peninsula element 206 and the electrical trace 214 extends onto the peninsula element 206 and conductively connects with the power input connector 208. The power input connector 208 is spaced from the junction 216 to define a fuse region 218 in the peninsula element 206.

While not shown, the trace 214 extends from the power input pin to a set of relays for supplying power to the electrical components, such as the heating element 46, controlled by the circuit board 200 and to the power supply for the circuit board. The power input connector 208 and electrical trace 214 may be configured for a 10 amp power supply and may be configured for a range of voltages, which may include by way of non-limiting example 120 volts and 220 volts. Although shown with two power input pins 210, 212 the power input connector 208 may have a different pin configuration.

As described above with respect to the first embodiment, the circuit board 200 may include additional parts such as a memory, a microprocessor, and other circuit elements such as resistors, diodes and capacitors (not shown). Such additional parts may be joined to the circuit board via solder joints 220. The circuit board 200 may have a conformal coating 222 applied to it after the components have been soldered. The conformal coating 222 may be applied in any suitable manner, for example by dipping or spraying the circuit board 200 and may be applied in such a manner that the conformal coating 222 is not present in the slot 204. The conformal coating 222 may aid in preventing corrosion and shorting due to condensation.

During an arc tracking event, the fuse region 218 acts likes a conventional fuse in that it electrically opens the power input pin 210 relative to the electrical trace 214. More specifically, the fuse region 218 evanesces with heat in response to arc tracking along the electrical trace 214 to the power input connector 208 to open the power input pin 210 relative to the electrical trace 214.

Figure 8:
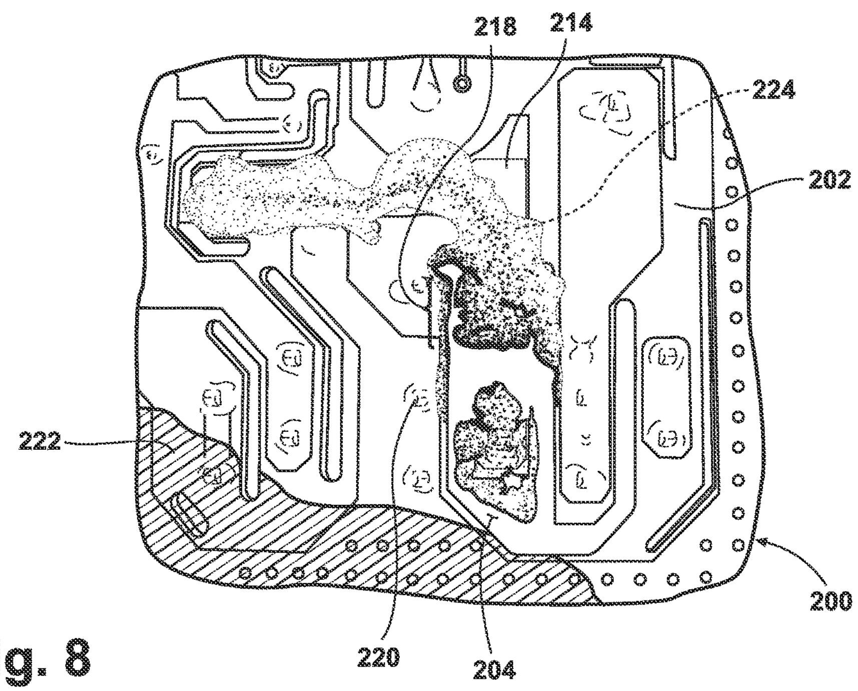
FIG. 8 is a top view of the portion of the circuit board of FIG. 7 after an arc tracking event has occurred.

FIG. 8 illustrates the circuit board 200 where an arc tracking event was forced during testing to illustrate that the fuse region 218 is physically configured such that failure from arc tracking results in evanescing of the fuse region 218 to physically separate the power input pins 210, 212 from the rest of the circuit board 200, which stops the supply of power to the circuit board 200. An arc track path 224 illustrates that arc tracking activity in the vicinity of the power input connector 208 migrates towards the first power input pin 210, which is the source of power for the arc tracking. The arc tracking will evanesce the fuse region 218 on the peninsula element 206, which connects the first power input pin 210 to the circuit board 200, resulting in an open in the electrical trace 214.

Testing has shown that for a circuit board 200, an arc tracking event typically forms a 4 to 5 mm hole in the circuit board 200. Therefore, the fuse region was physically designed to evanesce for this size hole, which may vary for different circuit board designs. Thus, sizes for alternative circuit boards, slots, and peninsula elements, may be experimentally determined based on holes formed during arc tracking events for any particular circuit board, slot, and peninsula element combination. The fuse region 218 is formed by the physical configuration of the circuit board 200 and for the circuit board 200, an appropriate fuse region 218 was formed by the peninsular element having the following dimensions: the first power input pin 210, may be at least 4 mm to 6 mm from the junction 216, with 5 mm as the illustrated dimension, and the peninsular element 206 in the fuse region 218 has a width of 3 mm to less than 5 mm, with 4 mm being the illustrated dimension. Other dimensions related to the peninsular element include that that the peninsula element 206 is 13 mm to 14 mm in length, that the power input pins 210, 212 are 5 mm apart, and that the electrical trace 214 may be less than 3 to 4 mm wide, with 3 mm being the illustrated dimension.

Figure 9:
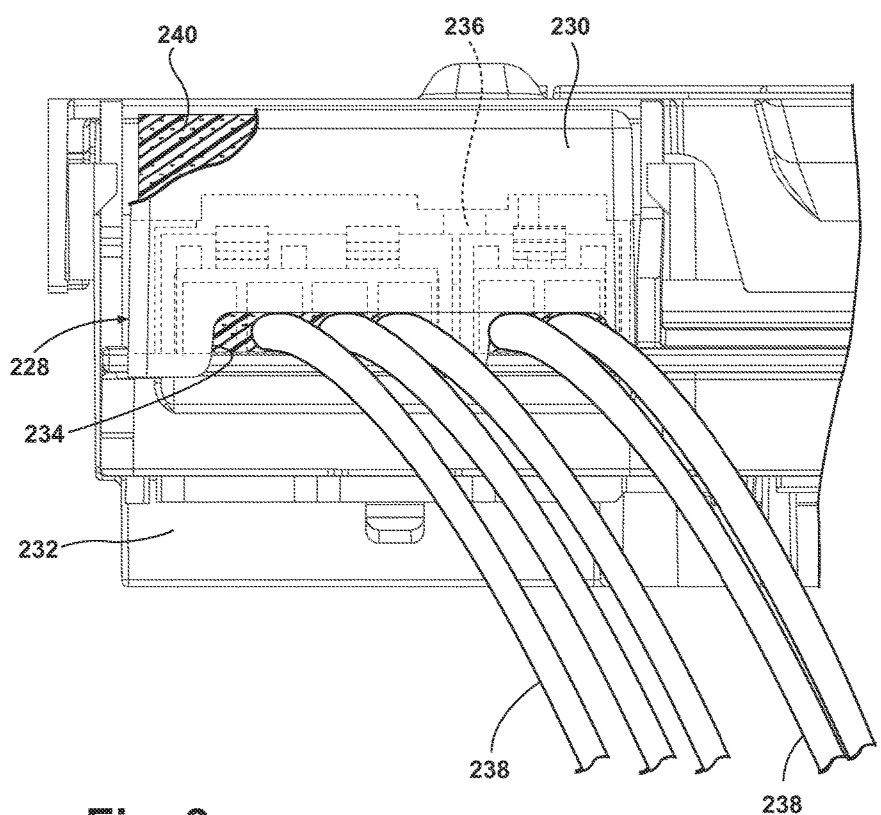
FIG. 9 is a side view of a portion of a control housing according to a third embodiment of the invention, similar to the control housing of FIG. 3 and which may be used in conjunction with the circuit board of FIG. 7.

While the above described fuse region 218 effectively stops power to the circuit board 200, the mating connector 236 will still have power being supplied to it. FIG. 9 illustrates the circuit board 200 may be used in combination with a connector box 228 according to a third embodiment of the invention such that the connector box 228 may enclose the mating connector and contain any arc tracking that may still occur in the mating connector itself. The connector box 228 is illustrated as including a cover 230, a base 232, which may be a portion of the connector brace 92 disclosed with respect to the first embodiment described above, as well as wire openings 234. A mating power connector 236 may be enclosed by the connector box 228 and wires 238 extending from the mating power connector 236 may extend through the wire openings 234. The connector box may include a gasket 240 that envelopes the mating power connector 236 and closes the wire openings 234. The gasket 240 may be any suitable type of gasket such as a foam gasket. By way of non-limiting example, the foam gasket 240 may be made from a blend of Nitrile and PVC.

During an arc tracking event where the fuse region 218 evanesces and opens, power still exists in the mating power connector 236 itself. The presence of the gasket 240 retards oxygen from reaching the power connectors 236 in the connector box 228 thereby preventing overheating. The connector box 228 may be formed of a more robust nonflammable material than the remainder of the housing and may act as an enclosure for the mating power connector 236. Enclosing the mating power connector 236 is easier and less expensive than enclosing the entire circuit board 200 as it is smaller and more localized. The connector box 228 may also help assure that the mating power connector 236 is fully seated as it forces the mating power connector 236 to be completely inserted inside the base 232.

Figure 10:
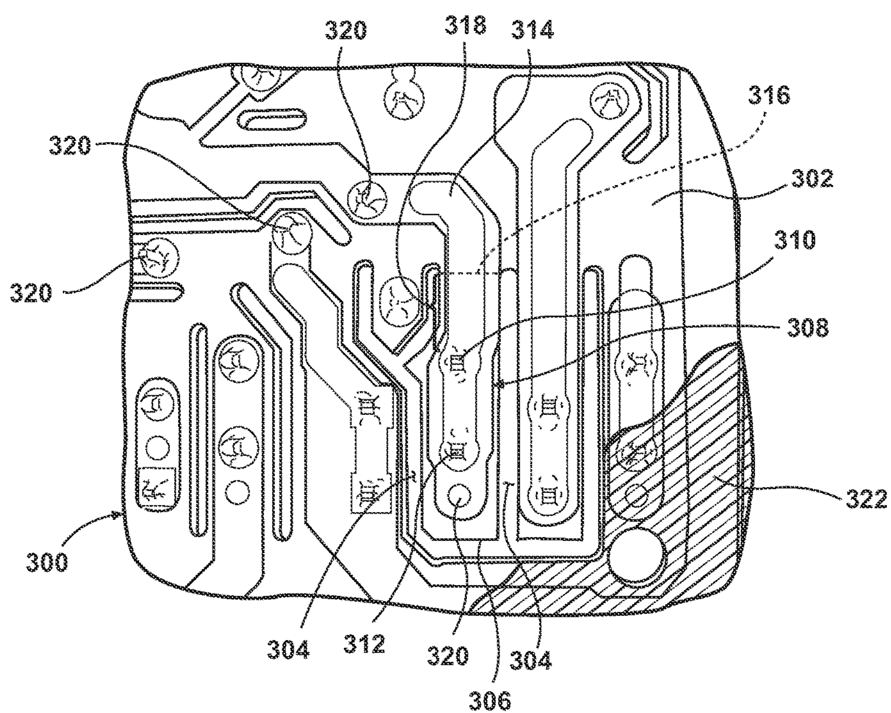
FIG. 10 is a top view of a portion of a circuit board according to a fourth embodiment of the invention, which may be used in conjunction with the control housing of FIG. 9.

FIG. 10 illustrates an alternative circuit board 300 according to a fourth embodiment. The fourth embodiment is similar to the second embodiment; therefore, like parts will be identified with like numerals increased by 100, with it being understood that the description of the like parts of the second embodiment applies to the fourth embodiment, unless otherwise noted.

One difference between the circuit board 300 and the circuit board 200 is that the slot 304, peninsula element 306, power input connector 308, and electrical trace 314 are shaped differently and will therefore form a different fuse region 318. Although the fuse region 318 will also evanesce and open during an arc tracking event, the resulting evanescing and arc track path will vary as the electrical trace 314 is smaller, which may further reduce the time and intensity of the arc tracking activity.

The above described circuit boards having the slots and peninsula elements are more predictable and robust than a conventional thermal protector because it is not always easy to locate the conventional thermal protector close enough to be responsive to an arc tracking event. Further, the above described circuit boards with the peninsula elements are not susceptible to nuisance tripping as is common with the conventional thermal protectors, wherein trip temperature settings must be set just above the normal operating temperatures to ensure that the conventional thermal protectors are responsive enough, which leads to nuisance tripping due to incremental, but benign, heating from things like loose connections or elevated operating temperatures. The fuse regions also cannot easily be defeated or shorted out by customers or service technicians once they have opened. The above described circuit boards with the slots and peninsula elements may perform the same function as conventional thermal protector circuits.

It has been contemplated that for large scale circuit boards, where circuits capable of arc tracking are remotely located from the incoming power pin and peninsula elements, a fuse or fuses may be added as stepping stones between the incoming power pin and the remote circuits. The remote circuits are typically high voltage but low current and arc tracking activity typically pulls at least spikes of high current. If the tracking currents are higher than the normal operating currents of these remote circuits, then the fuse may open and the arc tracking activity may be forced to track around the fuse to find power, which draws the tracking activity closer to the peninsula slots where it can then propagate down to the peninsula and open the connection to the incoming power pin.

While the invention has been specifically described in connection with certain specific embodiments thereof, it is to be understood that this is by way of illustration and not of limitation. Reasonable variation and modification are possible within the scope of the forgoing disclosure and drawings without departing from the spirit of the invention which is defined in the appended claims.

What is claimed is:

1. A circuit board comprising:

a substrate having perimeter edges bounding an interior section contained within the perimeter edges;

a slot formed in the interior section of the substrate and fully defining a peninsula element;

a power input connector provided on the peninsula element; and an electrical trace provided on the substrate and extending onto the peninsula element and conductively connected with the power input connector;

wherein the power input connector is spaced from a junction of the peninsula element and the substrate to define a fuse region in the peninsula element, between the junction and the power input connector, that evanesces with heat in response to arc tracking along the electrical trace to the power input connector to electrically open the power input connector relative to the electrical trace.

2. The circuit board of claim 1 further comprising conformal coating on the substrate.

3. The circuit board of claim 2 wherein the conformal coating is not present in the slot.

4. The circuit board of claim 1 wherein the peninsula element has a width of less than 5 mm at the fuse region.

5. The circuit board of claim 4 wherein the width is 3-4 mm.

6. The circuit board of claim 4 wherein the power input connector comprises at least one pin and the pin closest to the junction is at least 4 mm from the junction.

7. The circuit board of claim 6 wherein the at least one pin is 5 to 6 mm from the junction.

8. The circuit board of claim 6 wherein the electrical trace is less than 4 mm wide.

9. The circuit board of claim 8 wherein the electrical trace is less than 3 mm wide.

10. The circuit board of claim 1 wherein the power input connector is spaced from the junction by less than 5 mm.

11. The circuit board of claim 1 wherein the substrate includes insulating layers formed from at least one of FR-2 material and FR-4 material.

12. The circuit board of claim 1 wherein the power input connector and the electrical trace are configured for a 10 amp power supply.

13. The circuit board of claim 1 in combination with a connector box enclosing the power input connector.

14. The circuit board of claim 13 wherein the connector box comprises a gasket that envelopes the power input connector.

15. The circuit board of claim 14 wherein the connector box comprises wire openings and the gasket closes the wire openings.

16. The circuit board of claim 14 wherein the gasket is a foam gasket.

17. The circuit board of claim 16 wherein the foam gasket is made from a blend of Nitrile and PVC.

18. A circuit board comprising:

a substrate;

a continuous slot within the substrate fully defining a peninsula element portion of the substrate bounded by the continuous slot and a junction between the substrate and the peninsula element portion of the substrate;

a power input connector provided on the peninsula element portion of the substrate; and an electrical trace provided on the substrate and extending onto the peninsula element portion of the substrate and conductively connected with the power input connector;

wherein the power input connector is spaced from the junction and the substrate to define a fuse region in the peninsula element, between the junction and the power input connector, that evanesces with heat in response to arc tracking along the electrical trace to the power input connector to electrically open the power input connector relative to the electrical trace.

* * * * *